United States Patent [19]

Veneklasen et al.

[11] Patent Number: 6,011,269

[45] Date of Patent: Jan. 4, 2000

[54] SHAPED SHADOW PROJECTION FOR AN ELECTRON BEAM COLUMN

[75] Inventors: Lee H. Veneklasen, Castro Valley; Tai-Hon P. Chang, Foster City; Marian Mankos, San Francisco, all of Calif.

[73] Assignee: Etec Systems, Inc., Hayward, Calif.

[21] Appl. No.: 09/058,258

[22] Filed: Apr. 10, 1998

[51] Int. Cl.[7] ..................................................... H01J 37/30
[52] U.S. Cl. .................................. 250/492.23; 250/492.2; 250/492.22
[58] Field of Search ........................... 250/492.23, 492.2, 250/492.22, 492.1

[56] References Cited

U.S. PATENT DOCUMENTS

| | | | |
|---|---|---|---|
| 4,705,956 | 11/1987 | Ward | 250/492.2 |
| 5,341,063 | 8/1994 | Kumar | 313/309 |
| 5,616,926 | 4/1997 | Shinada et al. | 250/423 F |
| 5,689,117 | 11/1997 | Nakasuji | 250/492.23 |
| 5,747,819 | 5/1998 | Nakasuji et al. | 250/492.23 |

Primary Examiner—Edward P. Westin
Assistant Examiner—Nikita Wells
Attorney, Agent, or Firm—Skjerven, Morrill, MacPherson, Franklin and Friel

[57] ABSTRACT

A shaped electron beam column focuses electrons from an electron source to produce a shadow image of a shaped aperture on a writing plane. The shadow image of the shaped aperture is the defocused image of a shape aperture. This defocused shadow image is in the the object plane of the shaped electron beam column. The shadow image in the writing plane is defocused because an electron beam lens produces a focused image of the electron source off the writing plane. The size of the shadow image on the writing plane may be altered by adjusting the electron beam lens to change the distance between the electron source image and the writing plane, i.e., defocus. Thus, a relatively large shaped aperture may be used in comparison to shaped apertures used in conventional electron beam columns. Further, only a small total linear demagnification may be used, which permits the length of the shaped electron beam column to be decreased. Consequently, the electron-electron interactions are reduced resulting in increased edge resolution of the image on the writing plane and increased current in the shaped electron beam column thereby increasing throughput.

15 Claims, 4 Drawing Sheets

SHAPED SHADOW PROJECTION FOR AN ELECTRON BEAM COLUMN

FIELD OF THE INVENTION

The present invention relates to electron beam columns and in particular to a shaped electron beam column.

BACKGROUND

Electron beam columns are well known in the art. FIG. 1 is a diagram of a conventional shaped beam column 10, such as used in a conventional electron beam lithography tool that images a focused shape, defined by an aperture, onto a writing plane. Column 10 includes a low brightness electron source 12, such as a tungsten or $LaB_6$ thermionic emitter, (e.g., with 10–20 μm (micrometer) crossover), that produces an electron beam 13 that is converted into flood illumination 14 via an aperture 16 and electron beam lens 18, as is well understood in the art. Flood illumination 14 is projected on a square shaped aperture 20. A series of electron beam lenses 22 and 24, which may be magnetic lenses or electrostatic lenses, are used to focus the electrons passing through square shaped aperture 20 and project a demagnified image of square shaped aperture 20 on a writing plane 26. When column 10 is used as a lithography tool, writing plane 26 may be the surface of a mask blank or resist on the wafer.

As shown in FIG. 1, conventional shaped electron beam column 10 produces a focused image of square shape aperture 20 on writing plane 26. Typically, the size of square shaped aperture 20 used in column 10 is small and the image of square shaped aperture 20 on writing plane 26 is produced with a large total linear column demagnification. For example, where square shaped aperture 20 is 10×10 μm, a total linear column demagnification of 100 is needed to form a 100×100 nm (nanometer) image of square shaped aperture 20 on writing plane 26.

Column 10 generally uses a number of electron beam lenses to generate the desired large total linear column demagnification. The use of multiple electron beam lenses, however, results in a large column length. For example, conventional column 10 typically has a length of approximately 50 cm (centimeter). Unfortunately, the large length of column 10 creates a large amount of electron-electron interactions. As is well understood by those having ordinary skill in the art, electron-electron interactions decrease the edge resolution of the image projected on writing plane 26 resulting in edge blur of the image. This decreases the current that can be used in column 10, which decreases the throughput of column 10 when used for electron beam lithography.

In a conventional column it is desirable to have an edge blur of less than approximately twenty five percent of the minimum size image. For example, if column 10 should generate an image with approximate dimensions of 100×100 nm, the image will have an approximately 25 nm edge blur.

SUMMARY

Novel shaped beam optics in accordance with an embodiment of the present invention may be used with a conventional electron beam column or in a micro-electron-beam-column. This novel optics uses electrons from a very small electron source to form a shadow projection (instead of a focused image) of a shaped aperture on a writing plane. This novel shaped electron beam column includes a high brightness electron source which illuminates a shaped aperture, such as a square shaped aperture. The electron beam lens focuses electrons passing through the shaped aperture into an image of the electron source. However, electron source image is focused off the writing plane. If the source is much smaller than the shape, a shadow image of the shape appears at the writing plane. The electron source image may be focused by the electron beam lens either above or below the writing plane.

The size of the shape image on the writing plane may be altered by adjusting the electron beam lens to change the distance between the electron source image and the writing plane. Thus, the shaped aperture used in the shaped electron beam column may be large relative to shaped apertures used in conventional electron beam columns. Further, the shaped electron beam column may use a small total linear demagnification between the electron source and the electron source image, thereby reducing the number of necessary lenses as well as the length of the shaped electron beam column. The reduced length of the shaped electron beam column results in decreased electron—electron interactions, which improves the edge resolution of the image projected on writing plane. The reduced electron-electron interaction allows a higher current in the shaped electron beam column than found in conventional columns, thereby increasing throughput when the shaped electron beam column is used as a lithography tool.

BRIEF DESCRIPTION OF THE DRAWINGS

The above and other features, aspects, and advantages of the present invention will become better understood with regard to the following description, appended claims, and accompanying figures, where:

DETAILED DESCRIPTION

Figure 1:
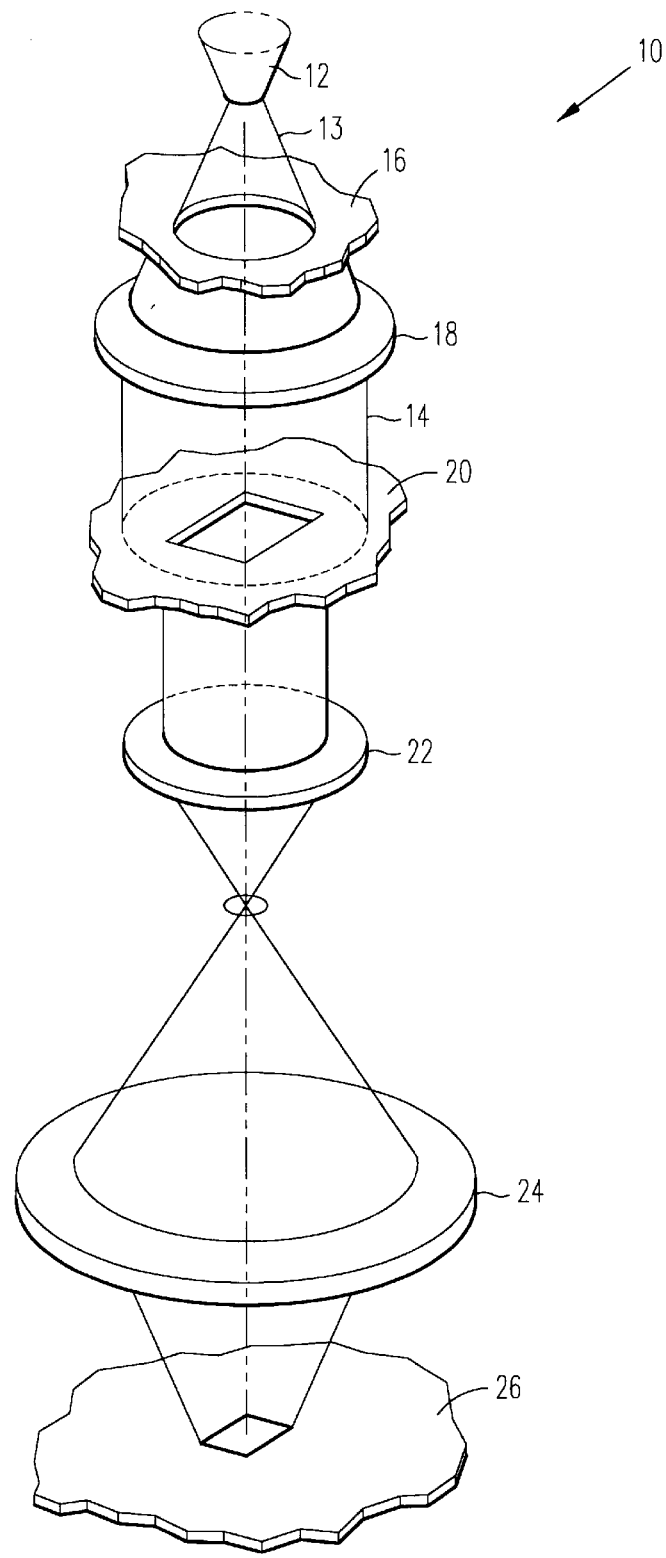
FIG. 1 is a diagram of a conventional shaped electron beam column 10, used as an electron beam lithography tool.
Figure 2:
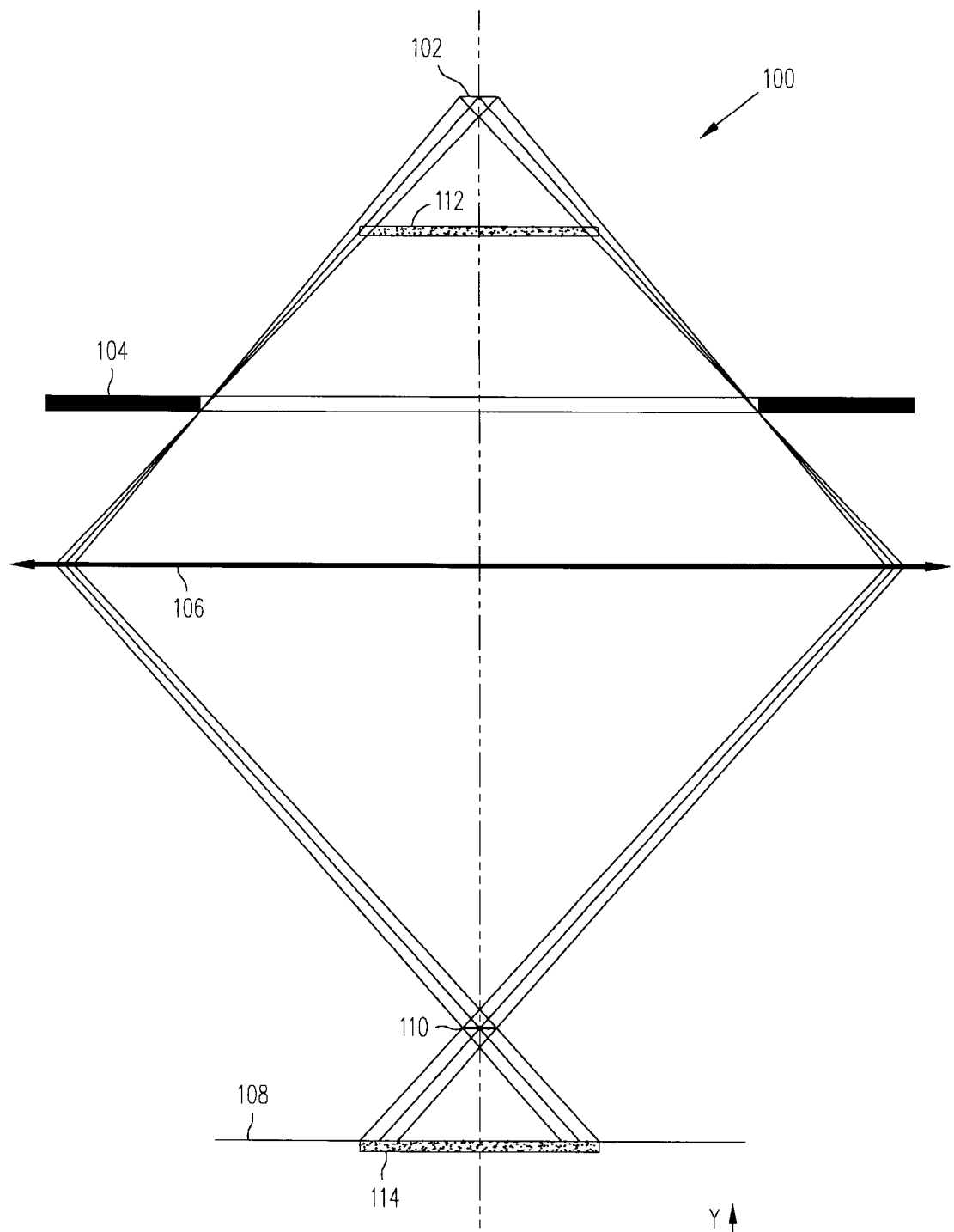
FIG. 2 is a diagram of a shaped electron beam column that uses shadow projection of the shaped aperture.

A shaped electron beam column 100 using shadow projection of a shaped aperture is shown diagramatically in FIG. 2. Shadow projection of the shape permits the use of a small total linear demagnification relative to conventional shaped electron beam columns. The relatively small total linear demagnification permits the use of a relatively short column length, which decrease electron-electron interactions, thereby increasing throughput.

A high brightness electron field emitter (not shown), such as a field emission, Schottky emission source, or photocathode, is used as an electron source 102. As is well understood by those with ordinary skill in the art, a field emission or Schottky emission source may generate an effective electron source 102 that is approximately 15 nm in diameter by the focusing and accelerating action of the extraction electrode (not shown). A highly bright and small size electron source 102 is desirable to increase the resolution of the projected image. For example, the brightness of electron source 102 may be $10^8$ Amp/(cm$^2$sr), producing a current in column 100 that is between approximately 0.5 μamp and 3 μamp. A Schottky emission source from FEI, Inc. in Hillsboro, Oreg. is one example of an electron source that may be used. It should be understood that although shaped electron beam column 100 is described as using a conventional electron source, a smaller micro-electron-beam-column may also be used in a similar manner. Microcolumns are discussed in general in the publication "Electron-Beam Microcolumns for Lithography and Related Applications," by T. H. P. Chang et al., Journal of Vacuum Science Technology Bulletin 14(6), pp. 3774–81, November/December 1996, which is incorporated herein by reference.

Electron source 102 illuminates a square shaped aperture 104. Square shaped aperture 104 may be a conventional ion milled aperture where the square shape is approximately 1–100 μm square, for example. Of course apertures having other shapes and sizes may also be used.

An electron beam lens 106 focuses the electrons passing through square shaped aperture 104. Electron beam lens 106 is shown in FIG. 2 as a single lens for the sake of simplicity. As those skilled in the art will understand, several electron beam lenses may be used if desired. However, because column 100 requires little total linear demagnification, a single electron lens 106 may advantageously be used to focus the electrons passing through square shaped aperture 104. Using an electron beam lens to focus electrons passing through an aperture is well understood by those of ordinary skill in the art.

As shown in FIG. 2, electron beam lens 106 focuses the electrons passing through square shaped aperture 104 to cross over above the writing plane 108 by a distance of approximately 5 to 50 μm depending on the desired demagnification. A focused electron source image 110 is formed at the point of crossover. Thus, electron source image 110 is formed off writing plane 108. As shown in FIG. 2, electron source image 110 is formed above writing plane 108. Writing plane 108 may be for example the surface of the resist on a wafer (not shown) being exposed where shaped electron beam column 100 is used as a lithography tool. When shaped aperture 104 is illuminated by electron source 102, which is smaller than shaped aperture 104, a well resolved shadow of shaped aperture 104 is located at the object plane 112 of electron beam lens 106. The electron beam lens 106 projects the image of the "virtual" square shape at object plane 112 to form a square shape shadow image 114 on the writing plane 108 of the substrate surface slightly below the electron source image 110.

The size of square shape shadow image 114 may be varied by focusing the electron source image 110 closer to or further from writing plane 108 using electron lens 106. Unlike conventional columns which project the image of square shape aperture 104 itself on writing plane 108, column 100 projects a square shape shadow image 114 on writing plane 108. Column 100 may use a relatively large shape aperture and adjust the size of the shadow projection image on writing plane 108 by adjusting the focus of electron beam lens 106.

Column 100 has a total linear demagnification between electron source 102 and electron source image 110 that is approximately 1, although a different value of total linear demagnification may be used if desired to match source emission characteristics. Because little total linear demagnification is used in column 100, electron beam lens 106 may be relatively simple compared to the lens system used in a conventional column. Further, because column 100 uses little total linear demagnification, the length of column 100 may be approximately 0.4 to 0.5 times the length of a conventional column, while still producing the same image parameters on the writing plane.

Because column 100 has a short length relative to conventional columns there are less electron—electron interactions within column 100. Edge blur of the square shape shadow image 114 projected on writing plane 108 caused by electron-electron interactions is reduced because of the relatively short length of column 100. This allows the use of a higher current electron beam than found in conventional columns, resulting in an increased throughput when column 100 is used as a lithography tool.

Figure 3:
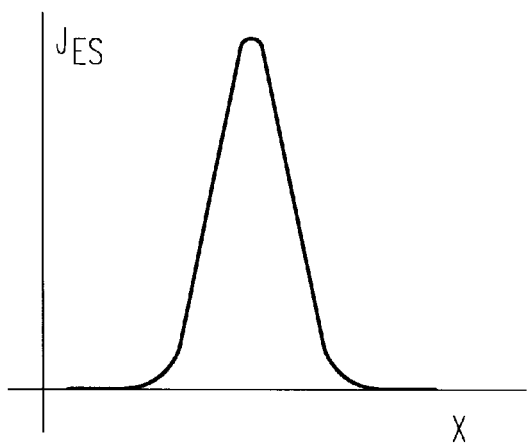
FIG. 3 illustrates the current density distribution $J_{ES}$ of an electron source image projected above the writing plane by the shaped electron beam column of FIG. 2.
Figure 4:
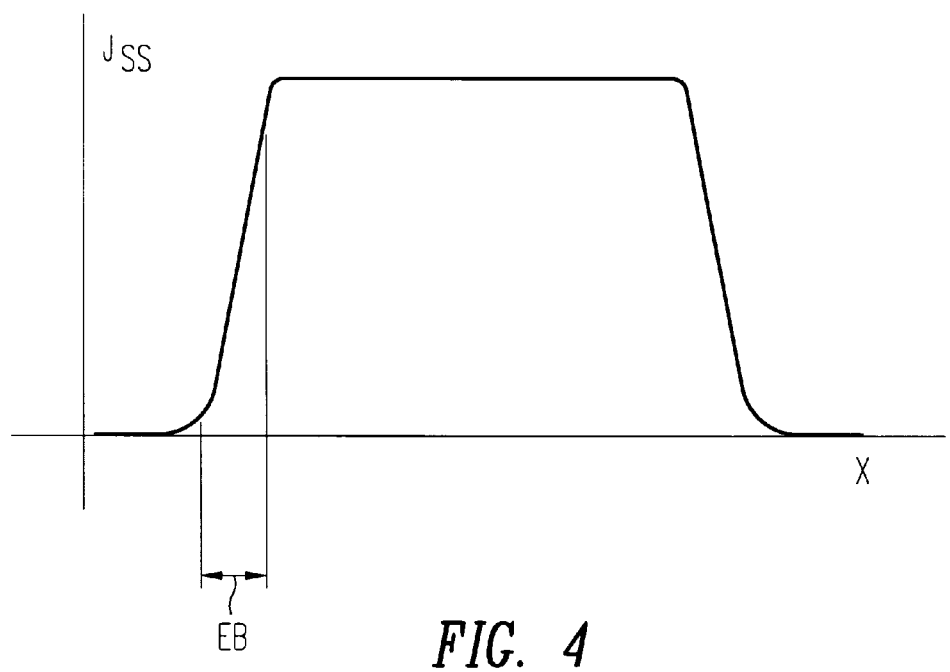
FIG. 4 illustrates the current density distribution $J_{SS}$, including edge blur, of the shadow projected image of the square shape on the writing plane of the substrate, projected by the shaped electron beam column of FIG. 2.

The current density distributions $J_{ES}$ and $J_{SS}$ of column 100 are shown in FIGS. 3 and 4, respectively. As shown in FIGS. 3 and 4, the Y axes represent current density distributions $J_{ES}$ and $J_{SS}$, respectively, while the X axes represent position along the X axis as shown in FIG. 2. FIG. 3 illustrates the current density distribution $J_{ES}$ of electron source image 110. As shown in FIG. 3, electron source image 110 has approximately a Gaussian intensity distribution $J_{ES}$ generated because electron source image 110 is focused by electron beam lens 106.

FIG. 4 illustrates the current density distribution $J_{SS}$ of square shape shadow image 114 on writing plane 108, showing the edge blur EB caused by the defocusing of square shape shadow image 114. The current density distribution $J_{SS}$ of square shape shadow image 114 is the convolution of the Gaussian distribution of electron source image 110, shown in FIG. 3, and the square shape transmission function of electrons passing through square shape aperture 104. Thus, the edge blur is a penumbra whose width is less than or equal to the size of electron source image 110. When lens aberrations are neglected, the source image can be approximately 10–25 nm.

Aberrations generated by electron beam lens 106 and the electron-electron interaction within column 100 will increase the size of electron source image 110. Some of these aberrations add to the edge blur of square shaped shadow image 114. However, geometric aberrations, such as spherical, may be shown to create a distortion of the shape instead of an edge blur. In the system shown in FIG. 2, spherical aberration does not place a limitation on the achievable edge resolution. For example, a shaped beam micro-column that is a few millimeters in length and uses the configuration of column 100, may produce a square shape shadow image 114 with a size of 100×100 nm with an edge blur that is less than approximately 25 nm.

Figure 5:
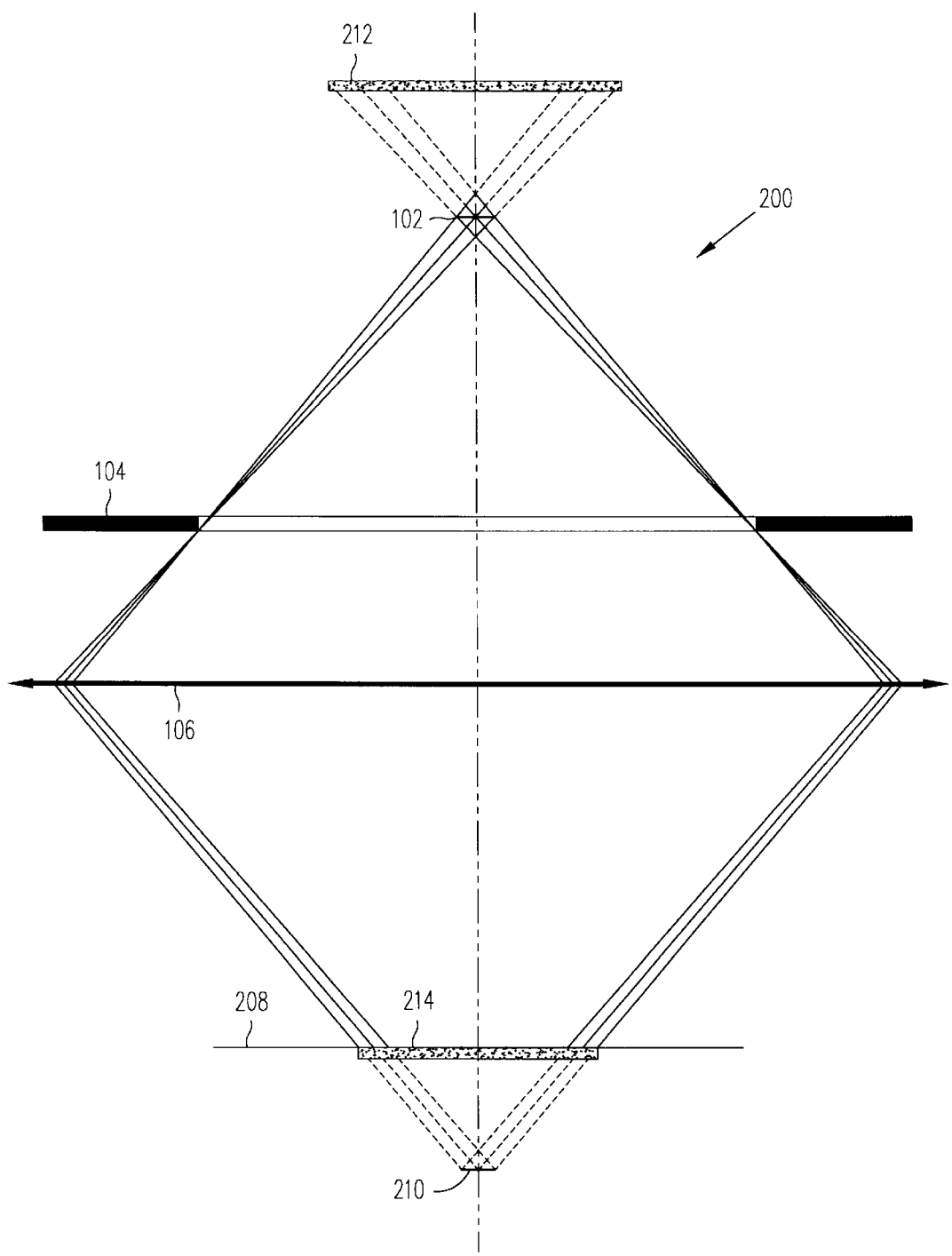
FIG. 5 is a diagram of an alternative shaped electron beam column that uses shadow projection of the shaped aperture with the source image below the writing plane.

FIG. 5 is a diagram of an alternative shaped electron beam column 200 that uses shadow projection of the shaped aperture. Column 200 is similar in structure and operation to column 100 shown in FIG. 2, like elements being designated the same, where electron beam lens 106 projects a square shape shadow image 214 on writing plane 208. However, electron beam lens 106 in column 200 focuses the electron source image 210 beneath the writing plane 208. The virtual object plane 212 of the electron beam lens 106 is above electron source 102. There is no crossover of electrons between square shaped aperture 104 and writing plane 208.

Although embodiments of the shaped electron beam column have been described in considerable detail, other embodiments are possible. For example, alternate shaped apertures may be used in place of square shape aperture 104 and multiple electron beam lenses may be used if desired. Further, the described shaped electron beam columns may be used with a conventional electron source and/or with either a conventional or micro-electron-beam-columns. Accordingly, the spirit and scope of the appended claims should not be limited to the description of the versions depicted in the figures.

What is claimed is:

1. A shaped electron beam column comprising:

an electron source producing electrons;

a shaped aperture in the path of said electrons, said electrons passing through said shaped aperture;

wherein said electrons form a shadow of said shaped aperture;

an electron beam lens focusing said electrons passing through said shaped aperture; and a writing plane, wherein said shadow of said shaped aperture is projected on said writing plane by said electron beam lens.

2. The shaped electron beam column of claim 1, wherein said electron beam lens focuses said electrons passing through said shaped aperture into an electron source image off said writing plane.

3. The shaped electron beam column of claim 1, wherein said electron source is a field emission source.

4. The shaped electron beam column of claim 1, wherein said electron source is a Schottky emission source.

5. The shaped beam column of claim 1, wherein said electron source is a photocathode.

6. The shaped electron beam column of claim 1, wherein said shaped aperture has a square shape.

7. The shaped electron beam column of claim 1, wherein said electron beam lens is comprised of a single electron beam lens element.

8. The shaped electron beam column of claim 1, wherein said electron source image is focused between said electron beam lens and said writing plane.

9. The shaped electron beam column of claim 1, wherein said electron source image is focused beneath said writing plane.

10. The shaped electron beam column of claim 1, wherein said shaped electron beam column is a shaped electron beam micro-column.

11. A method of producing a shaped electron beam column, said method comprising:

illuminating a shaped aperture with electrons wherein said electrons form a shadow of said shaped aperture; and focusing said electrons passing through said shaped aperture to project said shadow of said shaped aperture on a writing plane.

12. The method of claim 11, wherein said image of said shadow of said shaped aperture on said writing plane is defocused.

13. The method of claim 11, further comprising generating an electron source illuminating said shaped aperture with electrons.

14. The method of claim 13, further comprising focusing electrons passing through said shaped aperture into an image of said electron source above or below said writing plane.

15. The method of claim 13, further comprising focusing electrons passing through said shaped aperture into an image of said electron source between said writing plane and said electron source.

* * * * *